United States Patent
Lee et al.

(10) Patent No.: US 10,109,593 B2
(45) Date of Patent: Oct. 23, 2018

(54) SELF SHIELDED SYSTEM IN PACKAGE (SIP) MODULES

(71) Applicant: Apple Inc., Cupertino, CA (US)

(72) Inventors: Meng Chi Lee, Los Altos, CA (US); Shakti S. Chauhan, Cupertino, CA (US); Flynn P. Carson, Redwood City, CA (US); Jun Chung Hsu, Cupertino, CA (US); Tha-An Lin, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/947,353

(22) Filed: Nov. 20, 2015

(65) Prior Publication Data
US 2017/0025361 A1    Jan. 26, 2017

Related U.S. Application Data

(60) Provisional application No. 62/196,145, filed on Jul. 23, 2015.

(51) Int. Cl.
*H01L 23/552*    (2006.01)
*H01L 21/56*    (2006.01)
(Continued)

(52) U.S. Cl.
CPC .......... *H01L 23/552* (2013.01); *H01L 21/486* (2013.01); *H01L 21/561* (2013.01);
(Continued)

(58) Field of Classification Search
CPC ............ H01L 21/568; H01L 23/3121; H01L 23/49805; H01L 23/552; H01L 24/97; H01L 21/6835
See application file for complete search history.

(56) References Cited

U.S. PATENT DOCUMENTS 6,686,649 B1 * 2/2004 Mathews ............. H01L 23/552
                                                                 257/659
7,187,060 B2    3/2007 Usui
(Continued)

FOREIGN PATENT DOCUMENTS

CN    102254901 B    12/2013
KR    20130042171 A    4/2013

OTHER PUBLICATIONS

PCT/US2016/041139, filed Jul. 6, 2016, International Search Report and Written Opinion, dated Oct. 4, 2016, 14 pages.
(Continued)

*Primary Examiner* — Ermias Woldegeorgis
(74) *Attorney, Agent, or Firm* — Meyertons, Hood, Kivlin, Kowert & Goetzel, P.C.; Gareth M. Sampson; Lawrence J. Merkel

(57) ABSTRACT

A system in package (SiP) is disclosed that uses an EMI shield to inhibit EMI or other electrical interference on the components within the SiP. A metal shield may be formed over the SiP. The metal shield may be electrically coupled to a ground layer in a printed circuit board (PCB) to form the EMI shield around the SiP. The substrate of the SiP may include at least some metallization along vertical walls in the end portions of the substrate. The metallization may provide a large contact area for coupling the metal shield to a ground ring coupled to the ground layer in the PCB. The metallization along the vertical walls in the end portions of the substrate may be formed as through-metal vias in a common substrate before singulation to form the SiP.

18 Claims, 8 Drawing Sheets

(51) Int. Cl.
 H01L 23/498 (2006.01)
 H01L 23/00 (2006.01)
 H01L 21/48 (2006.01)
 *H01L 23/31* (2006.01)

(52) U.S. Cl.
 CPC ........ *H01L 23/49805* (2013.01); *H01L 24/97* (2013.01); *H01L 21/568* (2013.01); *H01L 23/3128* (2013.01); *H01L 23/49816* (2013.01); *H01L 2224/16227* (2013.01); *H01L 2224/97* (2013.01); *H01L 2924/1431* (2013.01); *H01L 2924/1434* (2013.01); *H01L 2924/15311* (2013.01); *H01L 2924/19041* (2013.01); *H01L 2924/19043* (2013.01); *H01L 2924/19105* (2013.01); *H01L 2924/3025* (2013.01)

(56) References Cited

U.S. PATENT DOCUMENTS

| | | | |
|---|---|---|---|
| 7,443,693 B2 | 10/2008 | Arnold et al. | |
| 8,008,753 B1 | 8/2011 | Bolognia | |
| 8,138,024 B2 | 3/2012 | Do et al. | |
| 8,183,130 B2 | 5/2012 | Lee et al. | |
| 8,378,466 B2 | 2/2013 | Chiu et al. | |
| 8,379,400 B2 | 2/2013 | Sunohara | |
| 8,653,633 B2 | 2/2014 | Liao et al. | |
| 8,710,676 B2 | 4/2014 | Chou et al. | |
| 8,786,060 B2 | 7/2014 | Yen et al. | |
| 9,001,528 B2 | 4/2015 | Yorita et al. | |
| 9,123,718 B1 | 9/2015 | Foster | |
| 2004/0178472 A1* | 9/2004 | Zhang | H01L 23/552 257/531 |
| 2006/0145361 A1 | 7/2006 | Yang et al. | |
| 2009/0014847 A1 | 1/2009 | Chen et al. | |
| 2009/0168386 A1 | 7/2009 | Suzuki et al. | |
| 2009/0184414 A1 | 7/2009 | Park et al. | |
| 2009/0256244 A1* | 10/2009 | Liao | H01L 21/568 257/660 |
| 2009/0302436 A1* | 12/2009 | Kim | H01L 21/561 257/659 |
| 2010/0020518 A1 | 1/2010 | Bustamante | |
| 2010/0096741 A1 | 4/2010 | Pan et al. | |
| 2010/0252937 A1 | 10/2010 | Uchiyama | |
| 2011/0006408 A1 | 1/2011 | Liao | |
| 2011/0260301 A1 | 10/2011 | Liao | |
| 2012/0043668 A1 | 2/2012 | Refai-Ahmed et al. | |
| 2012/0049347 A1 | 3/2012 | Wang | |
| 2012/0139090 A1 | 6/2012 | Kim et al. | |
| 2012/0193770 A1 | 8/2012 | Yamada et al. | |
| 2013/0082368 A1 | 4/2013 | Kim et al. | |
| 2013/0133940 A1 | 5/2013 | Chen et al. | |
| 2014/0150102 A1 | 5/2014 | Wang et al. | |
| 2014/0246781 A1 | 9/2014 | Hosomi | |
| 2015/0061095 A1 | 3/2015 | Choi et al. | |
| 2015/0084192 A1 | 3/2015 | Chiu et al. | |
| 2015/0171021 A1 | 6/2015 | Takano et al. | |

OTHER PUBLICATIONS

Office Action, Taiwan Intellectual Property Office (IPO), ROC (Taiwan) Patent Application No. 105122771, dated Apr. 25, 2017, 7 pages.
IPRP, PCT/US2016/041139, dated Feb. 1, 2018, 10 pages.

\* cited by examiner

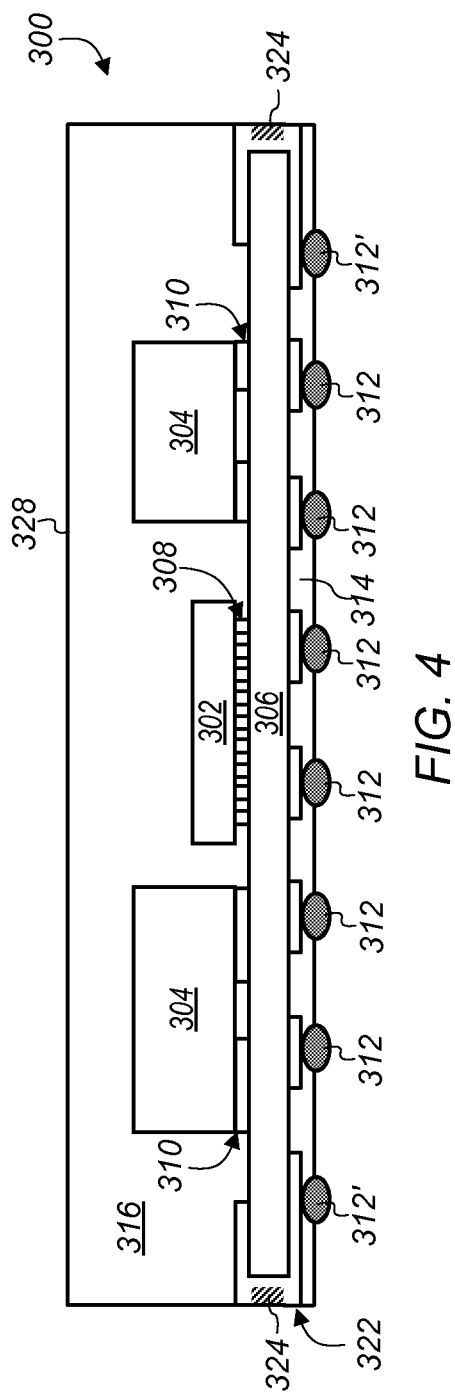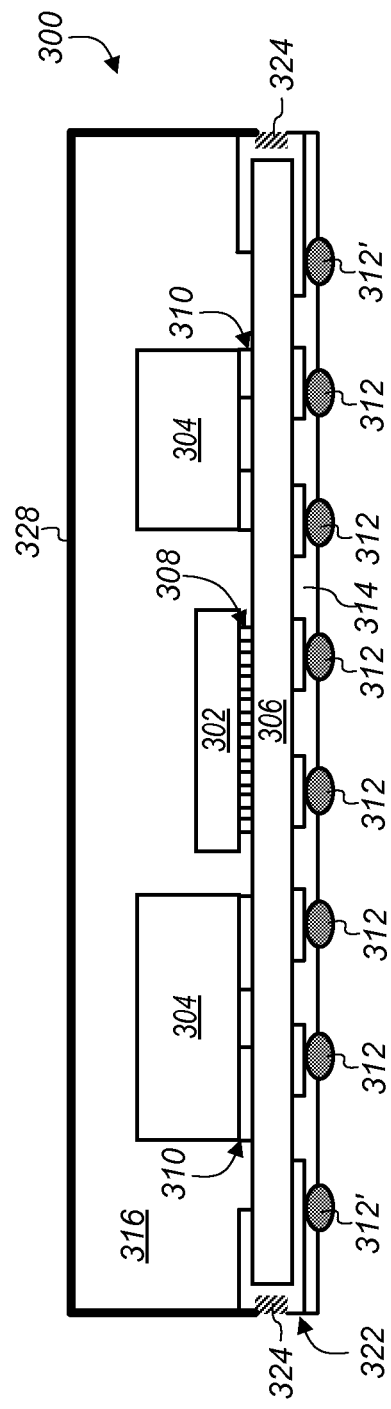

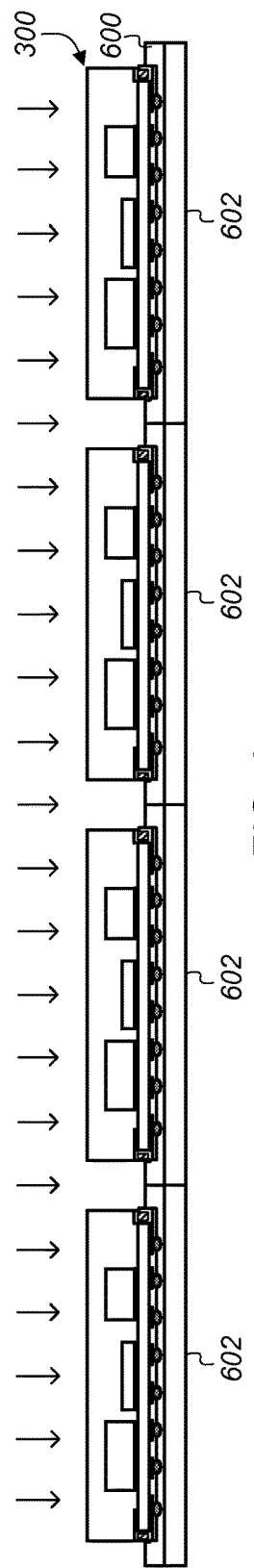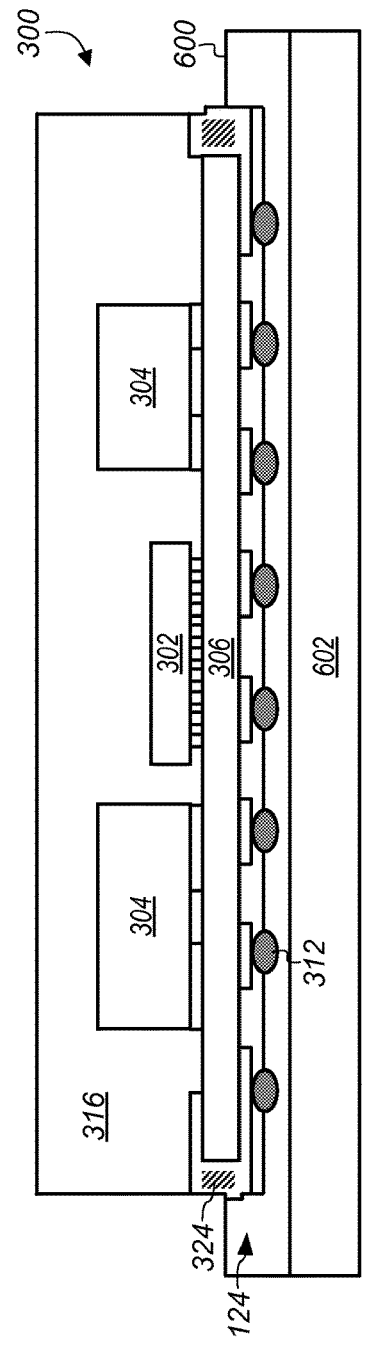

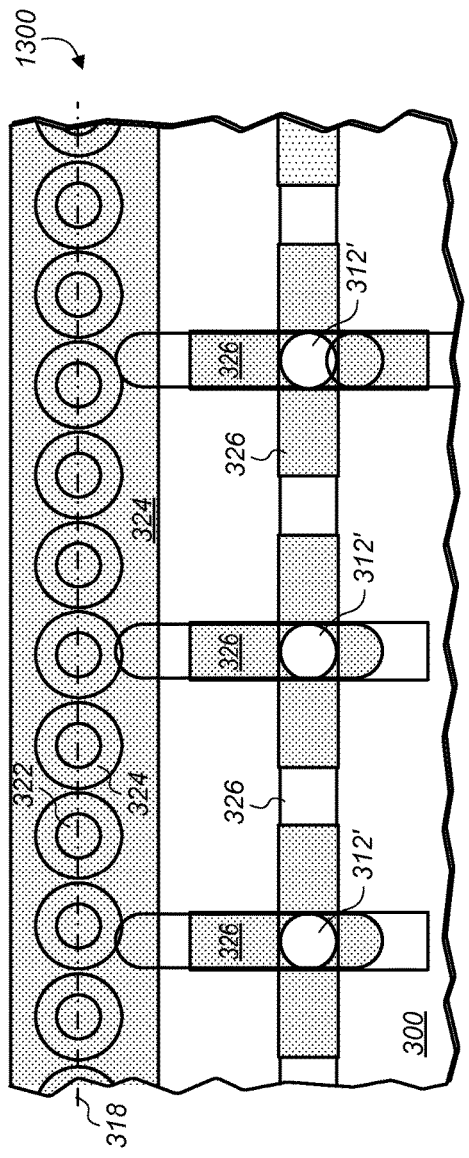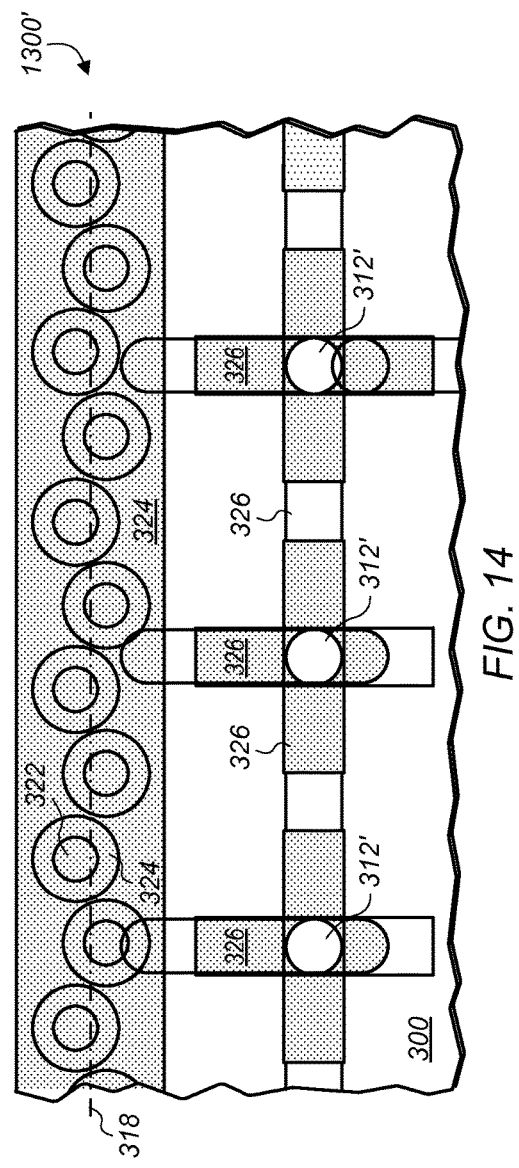

SELF SHIELDED SYSTEM IN PACKAGE (SIP) MODULES

PRIORITY CLAIM

This patent claims priority to U.S. Provisional Patent Application No. 62/196,145 to Lee et al., entitled "SELF SHIELDED SYSTEM IN PACKAGE (SiP) MODULES", filed Jul. 23, 2015, which is incorporated by reference in its entirety.

BACKGROUND

1. Technical Field

Embodiments described herein relate to system in packages (SiPs) and methods for making SiPs. More particularly, embodiments described herein relate to systems and methods for shielding SiPs from electromagnetic interference.

2. Description of Related Art

An SiP (system in package or system-in-a-package) includes one or more integrated circuits enclosed in a single module (e.g., a single package). The SiP may perform many (or all) of the functions of an electronic system. SiPs are typically used inside smaller electronic devices such as, but not limited to, mobile phones, digital music players, and tablets. An example of an SiP may include several chips (e.g., a specialized processor, DRAM, and/or flash memory) combined with passive components (e.g., resistors and capacitors) mounted on a single substrate. Mounting all the components on the single substrate provides a complete functional unit that can be built in a multi-chip package and few external components may be needed to make the device work. A drawback to SiPs is that any defective chip in the package will result in a non-functional packaged integrated circuit, even if all the remaining modules in the same package are functional.

EMI ("electromagnetic interference") is the unwanted effects in the electrical system due to electromagnetic (e.g., radio frequency (RF)) radiation and electromagnetic conduction. Electromagnetic radiation and electromagnetic conduction are different in the way an EM field propagates. Conducted EMI is caused by the physical contact of the conductors as opposed to radiated EMI which is caused by induction. Electromagnetic disturbances in the EM field of a conductor will no longer be confined to the surface of the conductor and may radiate away from it. Mutual inductance between two radiated electromagnetic fields may result in EMI.

Due to EMI, the electromagnetic field around the conductor is no longer evenly distributed (e.g., resulting in skin effects, proximity effects, hysteresis losses, transients, voltage drops, electromagnetic disturbances, EMP/HEMP, eddy current losses, harmonic distortion, and reduction in the permeability of the material).

EMI can be conductive and/or radiative and its behavior is dependent on the frequency of operation and cannot be controlled at higher frequencies. For lower frequencies, EMI is caused by conduction (e.g., resulting in skin effects) and, for higher frequencies, by radiation (e.g., resulting in proximity effects).

A high frequency electromagnetic signal makes every conductor an antenna, in the sense that they can generate and absorb electromagnetic fields. In the case of a printed circuit board ("PCB"), consisting of capacitors and semiconductor devices soldered to the board, the capacitors and soldering function like antennas, generating and absorbing electromagnetic fields. The chips on these boards are so close to each other that the chances of conducted and radiated EMI are significant. Boards are designed in such a way that the case of the board is connected to the ground and the radiated EMI is typically diverted to ground. Technological advancements have drastically reduced the size of chipboards and electronics and locating SiPs along with other components closer and closer together. The decreasing distances between components, however, means that chips (e.g., SiPs) are also becoming more sensitive to EMI. Typically electromagnetic shielding is used to inhibit EMI effects. However, EMI shielding for SiPs may be difficult and process intensive to integrate into the SiP structure.

FIG. 1 depicts a side-view cross-sectional representation of an example for providing EMI shielding for an SiP. SiP 100 includes silicon die 102 and passive devices 104 coupled to the upper surface of substrate 106. Substrate 106 may be a two layer substrate (e.g., a substrate with a core and two metal layers). Silicon die 102 and passive devices 104 are encapsulated in encapsulant 108. Terminals 110 may be coupled to the lower surface of substrate 106. Underfill material 112 (e.g., solder resist) may be formed on the lower surface of substrate 106 around terminals 110.

Terminals 110 may couple SiP 100 to printed circuit board (PCB) 114. PCB 114 may be, for example, a multilayer PCB. Shield 116 is formed over encapsulant 108 of SiP 100. Shield 116 is a metal shield. As shown in FIG. 1, to form an EMI shield for SiP 100, shield 116 contacts ground ring 118 at the lower edges of the shield (inside the dotted circles) on the ends (sides) of substrate 106. Ground ring 118 couples shield 116 to outermost terminals 110' on the lower surface of substrate 106. Terminals 110' are coupled to routing in PCB 114 that connects the terminals (and shield 116) to ground layer 120 at the bottom-most surface of the PCB. When shield 116 and ground layer 120 are electrically coupled, as shown in FIG. 1, they together form EMI shield 122 (e.g., a Faraday cage) around SiP 100.

A problem that occurs with making the shield structure shown in FIG. 1 is that it is difficult to ensure electrical connection between shield 116 and ground ring 118. FIG. 2 depicts an enlarged cross-sectional representation of an end portion of substrate 106 with shield 116 and ground ring 118 not connected. Typically, SiP 100 is placed on an adhesive surface (e.g., adhesive tape) or in a fixture pocket with raised walls during sputtering (or electroplating) of material for shield 116 to inhibit metal deposition on the lower surface of substrate 106. The adhesive surface or the walls of the fixture pocket may form region 124 around the end portion of substrate 106, as shown in FIG. 2. For example, the adhesive surface may extend up along the side surface of substrate 106 or the walls of the fixture pocket may contact or be very close to the side surface of the substrate.

Region 124 may be inaccessible for metal deposition of shield material on the side surface of substrate 106. The lack of metal deposition may form gap 126 between shield 116 and ground ring 118. In some cases, gap 126 may include a region with a lower thickness of metal deposition (and thus higher electrical resistivity) as compared to other regions of the module. Gap 126 inhibits electrical contact (e.g., metal to metal contact) between shield 116 and ground ring 118. The inaccessibility for metal deposition due to region 124 is a particular problem as ground ring 118 has a small thickness (about 10-15 μm), which provides a small target area for shield 116 to contact. As substrates get thinner and thinner, contacting the ground ring will become even more difficult. Without contact between shield 116 and ground ring 118, as shown in FIG. 2, it is difficult for a complete EMI shield to be formed as there is no electrical contact between the shield and ground layer 120 (shown in FIG. 1). Thus, as shown in FIG. 2, EMI shield 122 is an incomplete shield.

SUMMARY

In certain embodiments, metal shield is formed over a system in package (SiP). The SiP may include one or more die (e.g., processor and/or memory die) and one or more passive devices (e.g., resistors and/or capacitors) coupled to an upper surface of a substrate. The upper surface of the substrate and the die and passive devices may be encapsulated in an encapsulant. Terminals on a lower surface of the substrate may couple the SiP to a printed circuit board (PCB).

In certain embodiments, the metal shield is electrically coupled to a ground layer in the PCB to form an EMI shield around the SiP. The EMI shield may inhibit EMI or other electrical interference on the components within the SiP. In certain embodiments, the metal shield is coupled to at least some metallization along vertical walls in the end portions of the substrate. The metallization along the vertical walls in the end portions of the substrate may be via metallization from through-metal vias formed through a common substrate that remains after singulation of the common substrate to form the SiP. The substrate of the SiP may be a portion of the common substrate remaining after singulation.

In certain embodiments, a ground ring couples outermost terminals on the lower surface of the substrate to the metallization along the vertical walls in the end portions of the substrate. The outermost terminals on the lower surface of the substrate may couple to the ground layer in the PCB when the SiP is coupled to the PCB. Thus, when the metal shield is coupled to the metallization along the vertical walls in the end portions of the substrate, the metal shield is coupled to the ground layer in the PCB. The metallization along the vertical walls in the end portions of the substrate may provide a large contact area for coupling the metal shield to the ground ring to ensure connection between the shield and the ground layer in the PCB.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 4 depicts a side view cross-sectional representation of an embodiment of an SiP after singulation.

FIG. 5 depicts a side view cross-sectional representation of an embodiment of an SiP with a shield.

FIG. 6 depicts a side view cross-sectional representation of an embodiment of an SiP on an adhesive surface.

FIG. 9 depicts a side view cross-sectional representation of an embodiment a plurality of SiPs on an adhesive surface during metal deposition to form a shield.

FIG. 13 depicts an enlarged top view representation of an embodiment of a section in an SiP before singulation.

FIG. 14 depicts a top view representation of an embodiment of a section of an SiP with through-hole vias in a non-linear pattern.

Figure 1:
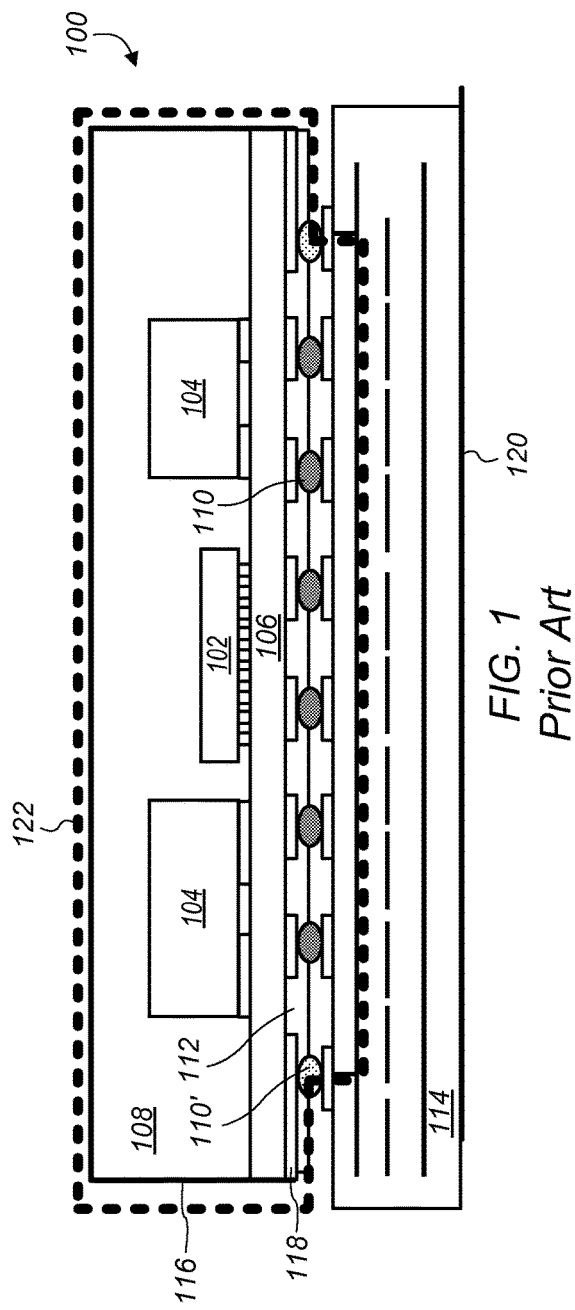
FIG. 1 depicts a side-view cross-sectional representation of an example for providing EMI shielding for an SiP.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. The hardware circuits may include any combination of combinatorial logic circuitry, clocked storage devices such as flops, registers, latches, etc., finite state machines, memory such as static random access memory or embedded dynamic random access memory, custom designed circuitry, programmable logic arrays, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) interpretation for that unit/circuit/component.

The scope of the present disclosure includes any feature or combination of features disclosed herein (either explicitly or implicitly), or any generalization thereof, whether or not it mitigates any or all of the problems addressed herein.

Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

Figure 3:
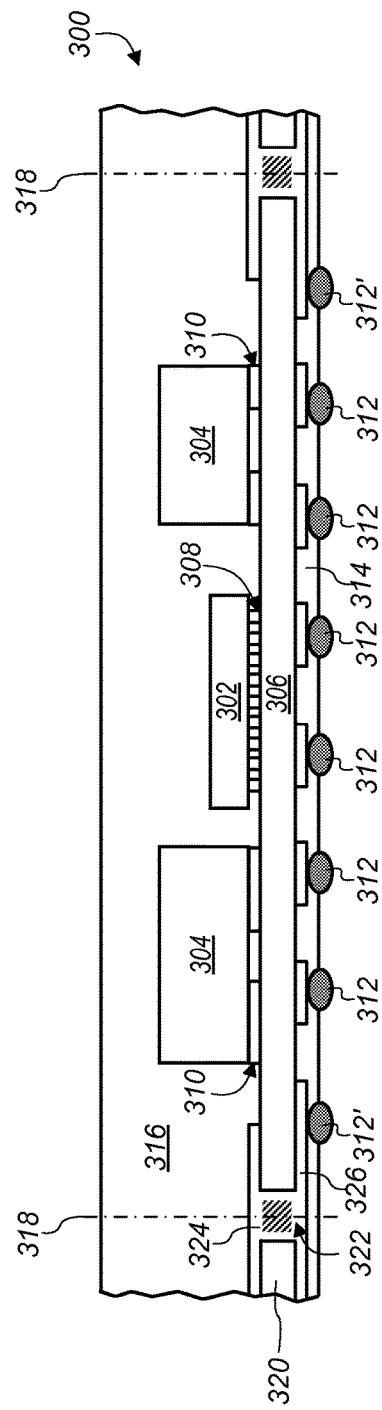
FIG. 3 depicts a side-view cross-sectional representation of an embodiment of a system in package (SiP).

FIG. 3 depicts a side-view cross-sectional representation of an embodiment of a system in package (SiP). In certain embodiments, SiP 300 includes die 302 and passive devices 304 coupled to an upper surface of substrate 306. In some embodiments, SiP 300 includes only passive devices 304 (e.g., the SiP is a passive SiP). In some embodiments, SiP 300 includes more than one die 302. Die 302 may include, for example, silicon die or integrated circuit die such as processor die or logic die. In some embodiments, die 302 include DRAM or other memory die. Passive devices 304 may include passive components such as, but not limited to, resistors and capacitors. Die 302 may be coupled to substrate 306 with terminals 308. Terminals 310 may couple passive devices 304 to substrate 306. In certain embodiments, terminals 308 and terminals 310 include pads, solder bumps, or combinations pads and solder bumps.

Substrate 306 may be a thin substrate such as a coreless substrate or a dielectric core substrate with metal layers. In certain embodiments, substrate 306 is a two-layer substrate having a dielectric core and two metal layers. In certain embodiments, substrate 306 has a thickness of at most about 60 µm. In some embodiments, substrate 306 has a thickness of at most about 100 µm, at most about 75 µm, or at most about 50 µm.

In certain embodiments, terminals 312 are coupled to a lower surface of substrate 306. Terminals 312 may include pads, solder bumps, or combinations of pads and solder bumps. Underfill material 314 may substantially surround terminals 312 on the lower surface of substrate 306. Underfill material 314 may be, for example, solder resist. Terminals 312 are exposed through underfill material 314 so that the terminals can couple SiP 300 to another component or device (e.g., a printed circuit board).

In certain embodiments, encapsulant 316 is formed over at least part of the upper surface of substrate 306. Encapsulant 316 may include, but not be limited to, a polymer or a mold compound such as an overmold or exposed mold compound. Encapsulant 316 may encapsulate die 302 and passive devices 304 on the upper surface of substrate 306. Encapsulating die 302 and passive devices 304 may protect the die and passive devices.

SiP 300, as depicted in FIG. 3, is shown before singulation of the SiP. Before singulation, SiP 300 is formed on a common substrate along with a plurality of additional SiPs. The SiPs are spaced apart on the common substrate to provide spaces between the SiPs for singulation (separation) of the SiPs into individual SiPs. Dashed lines 318, shown in FIG. 3, represent an embodiment of locations for singulation of SiP 300. Common substrate 320 may extend beyond dashed lines 318 (e.g., common substrate 320 supports the plurality of SiPs including SiP 300). Common substrate 320 may be, for example, the two-layer substrate described above for substrate 306. Substrate 306 may be the portion of common substrate 320 between dashed lines 318.

In certain embodiments, as shown in FIG. 3, through-hole vias 322 are formed in common substrate 320 at or near dashed lines 318. Thus, through-hole vias 322 may be formed in the end portions of substrate 306. Through-hole vias 322 may include via metallization 324 through common substrate 320. The process to form through-hole vias 322 and via metallization 324 in common substrate 320 may be a simple modification to current processes for forming common substrates for SiPs. In some embodiments, via metallization 324 extends partially on the surface of common substrate 320 (e.g., on the surface beyond the vertical walls of the via through the substrate). In certain embodiments, at least a portion of via metallization 324 is coupled to ground ring 326. Ground ring 326 may include metallization that couples to terminals 312' (the outermost terminals on the lower surface of substrate 306). Thus, via metallization 324 is coupled to terminals 312' through ground ring 326.

After the plurality of SiPs (including SiP 300) are formed on common substrate 320 (e.g., after encapsulation of the SiPs), the SiPs and the common substrate may be singulated (e.g., diced or sawed) along dashed lines 318 to form individual SiPs. FIG. 4 depicts a side view cross-sectional representation of an embodiment of SiP 300 after singulation. As shown in FIG. 4, after singulation, substrate 306 may include at least some via metallization 324 in the end portions of the substrate. In certain embodiments, at least some via metallization 324 remains along the substantially vertical walls in the end portions of substrate 306 after singulation. Thus, the location of dashed lines 318 (e.g., the singulation "cut" shown in FIG. 3) is adjustable (or flexible) as long as some via metallization remains after singulation. The thickness of via metallization 324 may also provide tolerance for different saw (or laser) cut widths or alignment errors in the saw (or laser).

After SiP 300 is formed by singulation, shield 328 may be formed over the SiP. FIG. 5 depicts a side view cross-sectional representation of an embodiment of SiP 300 with a shield. In certain embodiments, shield 328 is formed over encapsulant 316 and along the substantially vertical walls in the end portions of substrate 306. In certain embodiments, shield 328 is formed by metal deposition such as sputtering or electroplating on SiP 300.

Shield 328 may be, for example, a copper shield. In some embodiments, a thin layer of stainless steel is formed on the copper shield to protect the copper. In some embodiments, shield 328 includes copper with a thickness between about 5 µm and about 10 µm with a stainless steel layer of about 1 µm thickness over the copper. In some embodiments, shield 328 may include aluminum, ferrite, carbonyl iron, stainless steel, nickel silver, low-carbon steel, silicon-iron steel, foil, conductive resin, and other metals and composites capable of blocking or absorbing EMI, RFI (radio frequency interference), and other inter-device interference. In some embodiments, shield 328 may include a non-metal material such as carbon-black or aluminum flake to reduce the effects of EMI and RFI. For non-metal materials, shield 328 may be applied by lamination, spraying, or painting. In some embodiments, shield 328 may be formed as part of the encapsulation process such that encapsulant 316 includes materials such as noted above that reduce the effects of EMI and RFI.

As described above, SiP 300 is typically placed on an adhesive surface (e.g., adhesive tape) or in a fixture pocket with raised walls during metal deposition (e.g., sputtering or electroplating) of metal for shield 328 to inhibit metal deposition on the lower surface of substrate 306. FIG. 6 depicts a side view cross-sectional representation of an embodiment of SiP 300 on adhesive surface 600. Adhesive surface 600 may be, for example, adhesive tape. Adhesive surface 600 may be placed on metallization fixture 602 during metal deposition to form shield 328. As shown in FIG. 6, SiP 300 may sag into adhesive surface 600 such that region 124 is formed around the end portions of substrate 306. Additionally, warpage in SiP 300 may cause the SiP to not sit correctly on adhesive surface 600. Metal deposition along the side walls of SiP 300 may be inhibited in region 124.

Figure 7:
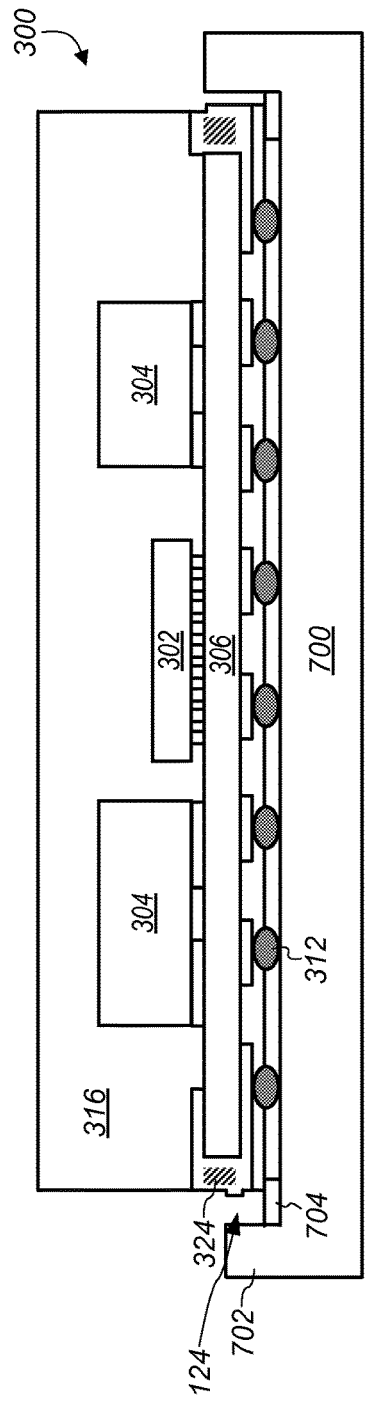
FIG. 7 depicts a side view cross-sectional representation of an embodiment of an SiP on a metallization fixture.

FIG. 7 depicts a side view cross-sectional representation of an embodiment of SiP 300 on metallization fixture 700. In certain embodiments, metallization fixture 700 includes raised walls 702 that form a pocket for SiP 300 during metal deposition to form shield 328. In some embodiments, underfill material 314 sits or rests on seat 704 in the pocket of metallization fixture 700. Seat 704 may inhibit metal deposition on the underside of SiP 300. As shown in FIG. 7, if SiP 300 is too close to wall 702 during metal deposition (e.g., the SiP is placed too close to the wall or shifts towards the wall), region 124 may be formed around the end portions of substrate 306. Additionally, warpage in SiP 300 may cause the SiP to not sit correctly pocket of metallization fixture 700. Metal deposition along the side walls of SiP 300 may be inhibited in region 124.

Figure 2:
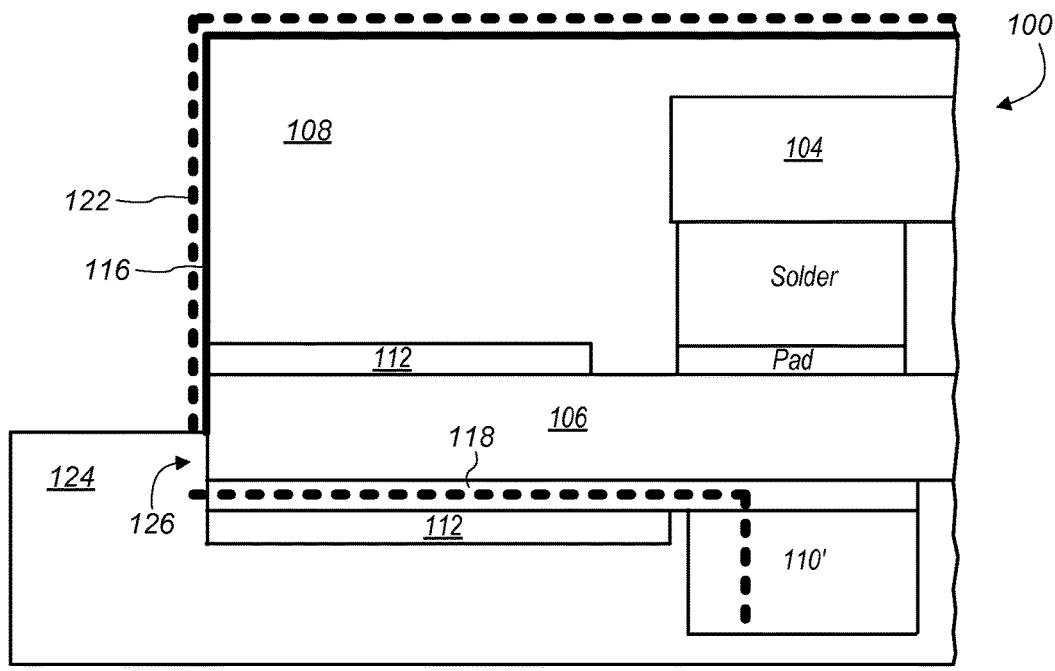
FIG. 2 depicts an enlarged cross-sectional representation of an end portion of a substrate with a shield and a ground ring not connected.
Figure 8:
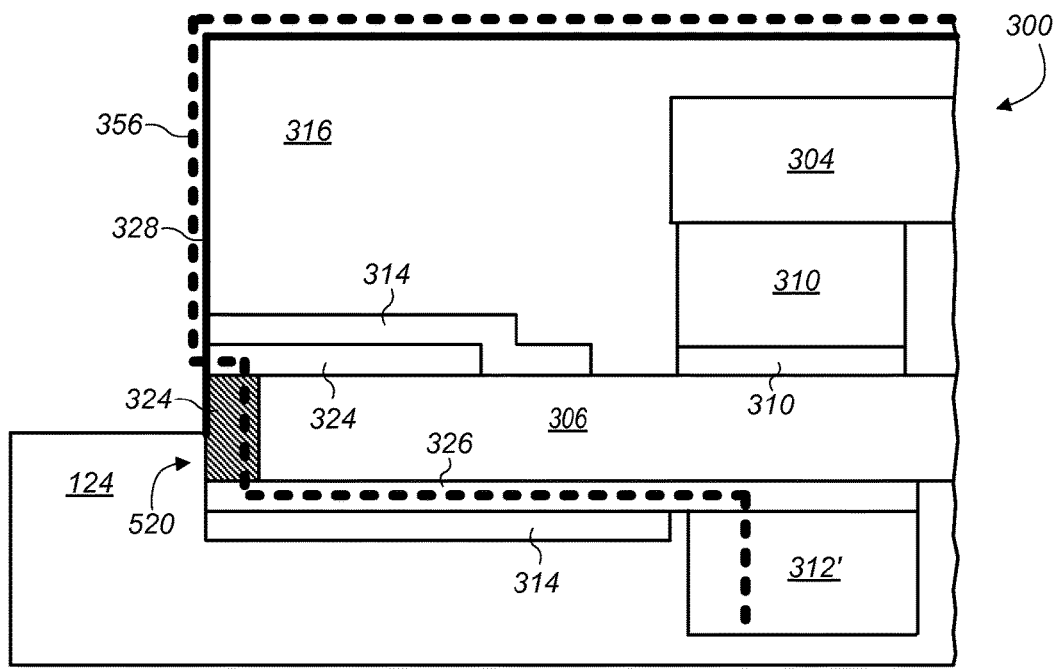
FIG. 8 depicts an enlarged cross-sectional representation of an end portion of a substrate with a shield coupled to via metallization.

FIG. 8 depicts an enlarged cross-sectional representation of an end portion of substrate 306 with shield 328 coupled to via metallization 324. As described above, region 124 may be inaccessible for metal deposition of shield material on the side surface of substrate due to an adhesive surface or a fixture pocket wall. As shown in FIG. 8, via metallization 324 may couple shield 328 to ground ring 326. The target area for connecting shield 328 to ground ring 326 is increased by the presence of via metallization 324 as any contact between the shield and the via metallization couples the shield to the ground ring. Thus, a target area for connecting shield 328 to ground ring 326 during metal deposition is at least the thickness of substrate 306 because via metallization 324 extends at least the height of substrate 306. For example, the target area may be about 100 μm whereas the target area without via metallization 324 (as shown in FIG. 2) may be at most about 10-15 μm. Thus, even if region 124 inhibits some metal deposition along the side walls of substrate 306, shield 328 may be in physical and electrical contact with via metallization 324 along the substantially vertical walls in the end portions of substrate 306 and the shield is electrically coupled to ground ring 126, as shown in FIGS. 5 and 8. The larger target area, therefore, increases the reliability of forming a connection between shield 328 and ground ring 326, increasing the yield of SiP 300 and reducing costs for forming SiPs.

Figure 10:
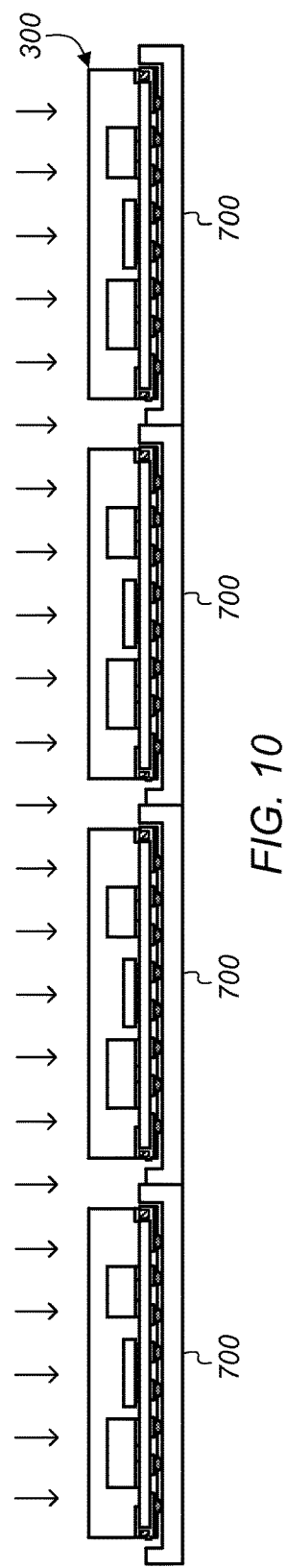
FIG. 10 depicts a side view cross-sectional representation of an embodiment a plurality of SiPs on a metallization fixture during metal deposition to form a shield.

It is to be understood that multiple SiPs may be processed simultaneously to form shields on each of the SiPs at substantially the same time. For example, a plurality of SiPs may be placed on adhesive surface 600 (shown in FIG. 6) or on metallization fixture 700 (shown in FIG. 7). FIG. 9 depicts a side view cross-sectional representation of an embodiment a plurality of SiPs 300 on adhesive surface 600 during metal deposition to form a shield. FIG. 10 depicts a side view cross-sectional representation of an embodiment a plurality of SiPs 300 on metallization fixture 700 during metal deposition to form a shield.

Figure 11:
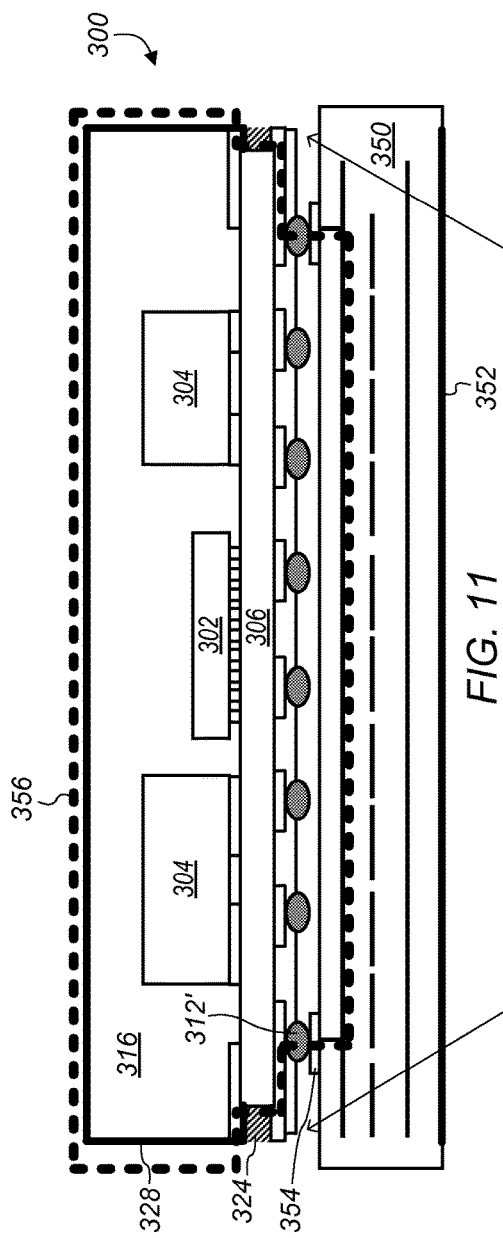
FIG. 11 depicts a side view cross-sectional representation of an embodiment of an SiP coupled to a printed circuit board (PCB).
Figure 12:
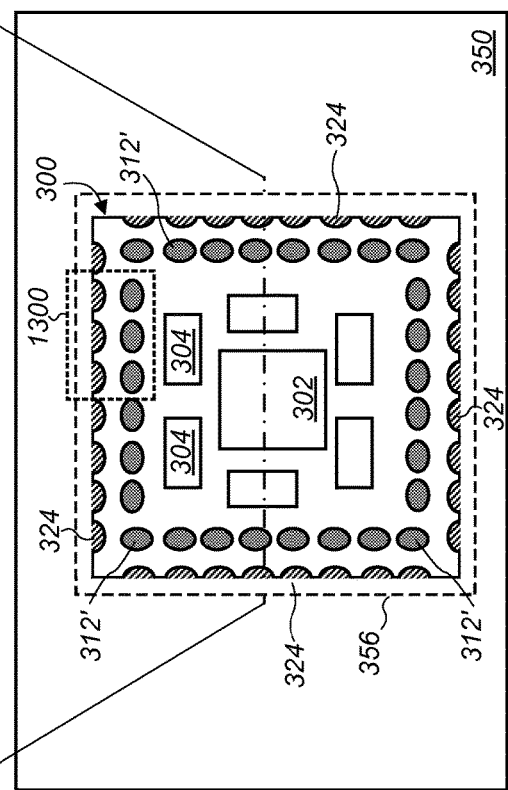
FIG. 12 depicts a top view representation of the embodiment depicted in FIG. 11 showing terminals and metallization formed around the perimeter of an SiP on a PCB.

After shield 328 is formed on SiP 300 (as shown in FIG. 5), the SiP may be coupled to a printed circuit board. FIG. 11 depicts a side view cross-sectional representation of an embodiment of SiP 300 coupled to printed circuit board (PCB) 350. FIG. 12 depicts a top view representation of the embodiment depicted in FIG. 11 showing terminals 312' and metallization 324 formed around the perimeter of SiP 300 on PCB 350. In certain embodiments, PCB 350 is a multilayer PCB. In certain embodiments, PCB 350 includes ground layer 352 at the bottom most surface of the PCB. Ground layer 352 may be coupled to terminals 354 on the upper surface of PCB 350.

As shown in FIG. 11, terminals 354 may be coupled to one or more of the outermost terminals 312' on SiP 300. Thus, due to the interconnection between outermost terminals 312' and shield 328 through ground ring 326 and via metallization 324, ground layer 352 is coupled to shield 328. In certain embodiments, the coupling of ground layer 352 and shield 328 forms EMI shield 356 (e.g., a Faraday cage or fence) around SiP 300, as shown in FIGS. 11 and 12. EMI shield 356 may inhibit electromagnetic interference (EMI), RFI, and/or other inter-device interference on the components in SiP 300 (e.g., die 302 and passive devices 304) during operation of the SiP.

FIG. 13 depicts an enlarged top view representation of an embodiment of section 1300 in SiP 300 from FIG. 12 before singulation through metallization 324 (e.g., metallization 324 is as shown in FIG. 3). As shown in FIG. 13 (similar to the embodiments shown in FIGS. 3 and 8), metallization 324 is formed through through-hole vias 322 with some metallization on the surface of the substrate. Metallization 324 is coupled to terminals 312' with ground ring 326. Dashed line 318 represents the line for singulation that forms SiP 300, as described above. As shown in FIG. 13, through-hole vias 322 are aligned substantially in parallel along dashed line 318 (e.g., the "singulation line").

In some embodiments, through-hole vias 322 are aligned along the singulation line with other patterns. FIG. 14 depicts a top view representation of an embodiment of section 1300' in SiP 300 with through-hole vias 322 aligned along dashed line 318 in a non-linear pattern. In certain embodiments, through-hole vias 322 are arranged in a staggered pattern along dashed line 318. In some embodiments, the staggered pattern of through-hole vias 322 is a zig-zag pattern of through-hole vias, as shown in FIG. 14.

Figure 15:
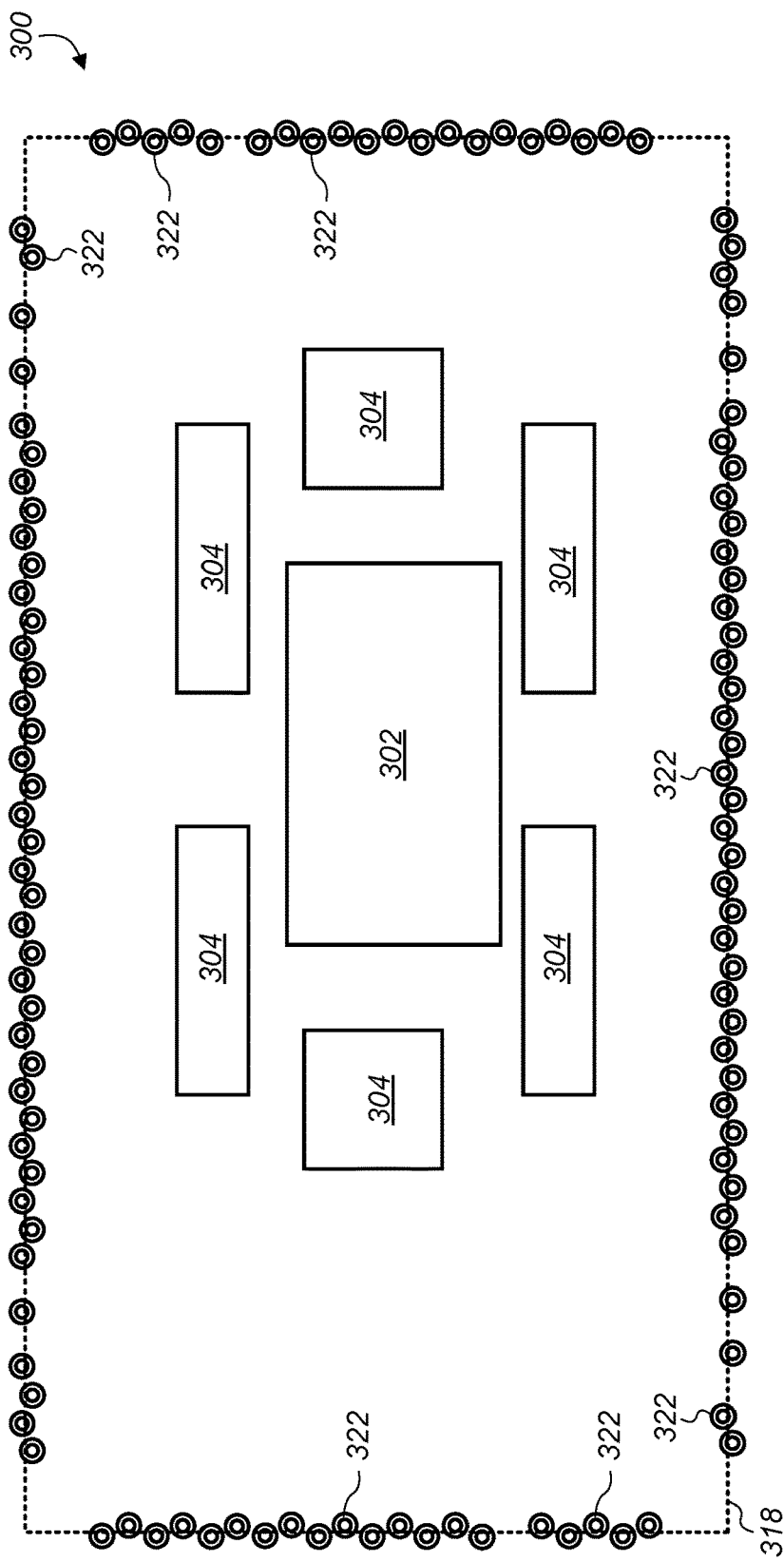
FIG. 15 depicts a top view representation of an embodiment of an SiP before singulation with through-hole vias in a staggered pattern.

FIG. 15 depicts a top view representation of an embodiment of SiP 300 before singulation with through-hole vias 322 aligned along dashed line 318 in the staggered pattern. The staggered pattern of through-hole vias 322 along dashed line 318, shown in FIGS. 14 and 15, may increase the tolerance for location of singulation (e.g., location of dashed line 318). For example, if singulation actually occurs above or below dashed line 318 as it is shown in FIG. 14, the staggered pattern of through-hole vias 322 along the dashed line increases the likelihood that at least some metallization 324 remains along the edge of the substrate in SiP 300 after singulation.

Further modifications and alternative embodiments of various aspects of the embodiments described in this disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as the presently preferred embodiments. Elements and materials may be substituted for those illustrated and described herein, parts and processes may be reversed, and certain features of the embodiments may be utilized independently, all as would be apparent to one skilled in the art after having the benefit of this description. Changes may be made in the elements described herein without departing from the spirit and scope of the following claims.

What is claimed is:

1. A semiconductor device package, comprising:
a substrate comprising dielectric in end portions of the substrate, wherein the substrate comprises at least some metallization along substantially vertical walls of the dielectric in the end portions of the substrate, the metallization along the substantially vertical walls in the end portions of the substrate comprising metallization remaining from a plurality of through-hole vias after singulation of the substrate, wherein the plurality of through-hole vias are aligned in a staggered pattern along the substantially vertical walls in the end portions of the substrate with at least some portion of each of the through-hole vias remaining after singulation along a straight line;
wherein at least some of the metallization is formed on the upper surface of the substrate in the end portions of the substrate, the metallization on the upper surface of the substrate being substantially continuous along at least one end portion of the substrate from a first end of the substrate to a second end of the substrate;
at least one passive component coupled to an upper surface of the substrate;
a ground ring formed on a lower surface of the substrate;
a plurality of terminals coupled to the lower surface of the substrate, the terminals configured to couple the substrate to a printed circuit board, wherein the terminals closest to the end portions of the substrate are coupled to the metallization along the substantially vertical walls of the end portions of the substrate with the ground ring formed on the lower surface of the substrate;
an encapsulant at least partially enclosing the upper surface of the substrate, wherein the encapsulant encapsulates the at least one passive component on the upper surface of the substrate; and
a shield formed over the encapsulant with end portions of the shield being coupled to the metallization along a vertical side of the metallization that is on a side of the metallization opposite the substantially vertical walls of the dielectric in the end portions of the substrate, wherein the shield inhibits, during use, electromagnetic interference.

2. The package of claim 1, further comprising at least one die coupled to the upper surface of the substrate and encapsulated in the encapsulant.

3. The package of claim 1, further comprising an underfill material at least partially encapsulating the lower surface of the substrate, wherein the terminals are exposed beyond a lower surface of the underfill material.

4. The package of claim 1, further comprising a printed circuit board coupled to the terminals, wherein the printed circuit board comprises a ground layer, and wherein the ground layer is coupled to the terminals closest to the end portions of the substrate such that the ground layer is coupled to the shield.

5. A semiconductor device package, comprising:
a substrate, wherein the substrate comprises at least part of a first through-hole via in a first end portion of the substrate, at least part of a second through-hole via in a second end portion of the substrate, at least part of a third through-hole via in the first end portion of the substrate and at least part of a fourth through-hole via in the first end portion of the substrate, the at least parts of the first, second, third, and fourth through-hole vias comprising metal, and wherein the first through-hole via, the third through-hole via, and the fourth through-hole via are positioned in a staggered pattern along a straight line in the first end portion of the substrate;
at least one passive component coupled to an upper surface of the substrate;
a plurality of terminals coupled to a lower surface of the substrate, the terminals configured to couple the substrate to a printed circuit board, wherein a terminal closest to the first end portion of the substrate is coupled to the at least part of the first through-hole via in the first end portion of the substrate, and wherein a terminal closest to the second end portion of the substrate is coupled to the at least part of the second through-hole via in the second end portion of the substrate;
an encapsulant at least partially enclosing the upper surface of the substrate, wherein the encapsulant encapsulates the at least one die and the passive devices on the upper surface of the substrate; and
a shield formed over the encapsulant with a first end portion of the shield being coupled to the at least part of the first through-hole via in the first end portion of the substrate and a second end portion of the shield being coupled to the at least part of the second through-hole via in the second end portion of the substrate, wherein the shield inhibits, during use, electromagnetic interference.

6. The package of claim 5, further comprising a printed circuit board coupled to the terminals, wherein the printed circuit board comprises a ground layer, and wherein the ground layer is coupled to the terminals closest to the first and second end portions of the substrate such that the ground layer is coupled to the shield.

7. The package of claim 6, wherein the shield and the ground layer form a Faraday cage around the semiconductor device during use.

8. The package of claim 5, further comprising at least one die coupled to the upper surface of the substrate.

9. The package of claim 5, wherein the at least parts of the first and second through-hole vias comprises metal remaining after singulation of the substrate.

10. The package of claim 5, wherein the die comprises a silicon die.

11. The package of claim 5, wherein the first through-hole via, the third through-hole via, and the fourth through-hole via are aligned along the straight line in the staggered pattern in the first end portion of the substrate.

12. The package of claim 5, further comprising at least some metallization on the upper surface of the substrate, the metallization on the upper surface being substantially continuous between the first, second, third, and fourth through-hole vias.

13. A semiconductor device package, comprising:
a substrate, wherein the substrate comprises at least part of a plurality of first through-hole vias in a first end portion of the substrate and at least part of a plurality of second through-hole vias in a second end portion of the substrate, the at least parts of the first and second through-hole vias comprising metal, and wherein the first through-hole vias are in a staggered pattern in the first end portion of the substrate, the first through-hole vias being staggered along a straight line extending from a first end of the staggered pattern to a second end of the staggered pattern with at least some part of each first through-hole via positioned on either side of the straight line;

at least one passive component coupled to an upper surface of the substrate;

a plurality of terminals coupled to a lower surface of the substrate, the terminals configured to couple the substrate to a printed circuit board, wherein a terminal closest to the first end portion of the substrate is coupled to at least one of the first through-hole vias in the first end portion of the substrate, and wherein a terminal closest to the second end portion of the substrate is coupled to at least one of the second through-hole vias in the second end portion of the substrate;

an encapsulant at least partially enclosing the upper surface of the substrate, wherein the encapsulant encapsulates the at least one die and the passive devices on the upper surface of the substrate; and a shield formed over the encapsulant with a first end portion of the shield being coupled to at least some of the first through-hole vias in the first end portion of the substrate and a second end portion of the shield being coupled to at least some of the second through-hole vias in the second end portion of the substrate, wherein the shield inhibits, during use, electromagnetic interference.

14. The package of claim 13, wherein the second through-hole vias are in a staggered pattern in the second end portion of the substrate.

15. The package of claim 13, wherein the staggered pattern comprises a zig-zag pattern.

16. The package of claim 13, further comprising at least one die coupled to the upper surface of the substrate.

17. The package of claim 13, wherein the at least parts of the first and second through-hole vias comprises metal remaining after singulation of the substrate, the straight line in the staggered pattern comprising a line of singulation passing through the staggered pattern of the first through-hole vias.

18. The package of claim 13, further comprising a printed circuit board coupled to the terminals, wherein the printed circuit board comprises a ground layer, and wherein the ground layer is coupled to the terminals closest to the first and second end portions of the substrate such that the ground layer is coupled to the shield.

* * * * *